United States Patent [19]

Wang

[11] 4,152,715
[45] May 1, 1979

[54] SILICON BASE CCD-BIPOLAR TRANSISTOR COMPATIBLE METHODS AND PRODUCTS

[75] Inventor: Chi-Shin Wang, San Jose, Calif.

[73] Assignee: The United States of America as represented by the Secretary of the Army, Washington, D.C.

[21] Appl. No.: 855,514

[22] Filed: Nov. 28, 1977

[51] Int. Cl.² .............................................. H01L 27/10
[52] U.S. Cl. ........................................ 357/24; 29/571;
29/569 L; 29/577 C; 148/1.5; 148/33; 148/187;
357/35; 357/44
[58] Field of Search .................... 148/1.5, 187, 33;
357/24, 44, 35, 43; 29/577 C, 571, 569 L

[56] References Cited

U.S. PATENT DOCUMENTS

| 3,930,893 | 1/1976 | Tchon | 148/1.5 |
| 3,981,072 | 9/1976 | Buie | 29/578 |
| 4,047,215 | 9/1977 | Frye et al. | 357/24 |
| 4,047,220 | 9/1977 | Ferro et al. | 148/187 X |

OTHER PUBLICATIONS

Grant et al., "Integrated CCD-Bipolar Structure for Focal Plane Processing of IR Signals", 1975 *International Conference on the Application of Charge-Coupled Devices*, Naval Electronics Laboratory Center, San Diego, Calif., Oct. 29-31, 1975, pp. 53-58.

Primary Examiner—G. Ozaki
Attorney, Agent, or Firm—Nathan Edelberg; Milton W. Lee; Aubrey J. Dunn

[57] ABSTRACT

CCDs and bipolar transistors are formed together on a silicon chip. For n channel CCDs and npn transistors, only a single extra diffusion is necessary in addition to the diffusions used for the CCDs alone. This step is diffusion of n+ collector wells, and is performed before CCD channel stop-transistor base diffusion. For p channel CCDs and pnp transistors, two extra diffusions are necessary and are: diffusion of a p collector wells, and diffusion of n+ base contracts; the extra diffusions may both be performed before CCD channel stop-transistor base diffusion, or the n+ base contact diffusion may be performed thereafter.

10 Claims, 2 Drawing Figures

SILICON BASE CCD-BIPOLAR TRANSISTOR COMPATIBLE METHODS AND PRODUCTS

The invention herein described was derived in the course of U.S. Government Contract DAAKO2-74-C-0229 with the Department of the Army.

BACKGROUND OF THE INVENTION

This invention is in the field of CCD read infrared image detectors on silicon chips and the methods whereby they are produced. It is advantageous with such detectors to have buffer amplifiers on the chips with the CCDs. Ordinarily such amplifiers are MOS transistors and are formed by processing steps distinct from the CCD steps. The instant invention allows triple diffused transistors and CCDs to be made on the same chips, with a minimum of extra steps in addition to the steps ordinarily used to produce the CCDs.

SUMMARY OF THE INVENTION

The invention is methods of producing circuits including CCDs and triple diffused bipolar transistors on silicon chips with a minimum of extra steps for the transistors in addition to those ordinarily employed for the CCDs, and the circuits produced by the methods. The invention uses an extra diffusion in addition to the usual diffusions used for CCDs to produce npn transistors with n channel CCDs. This step is n+ diffusion for transistor collector wells. With p channel CCDs, two additional diffusions are used: diffusion of p collector wells and diffusion of n+ base contracts for the transistors.

DETAILED DESCRIPTION OF THE INVENTION

Figure 1:
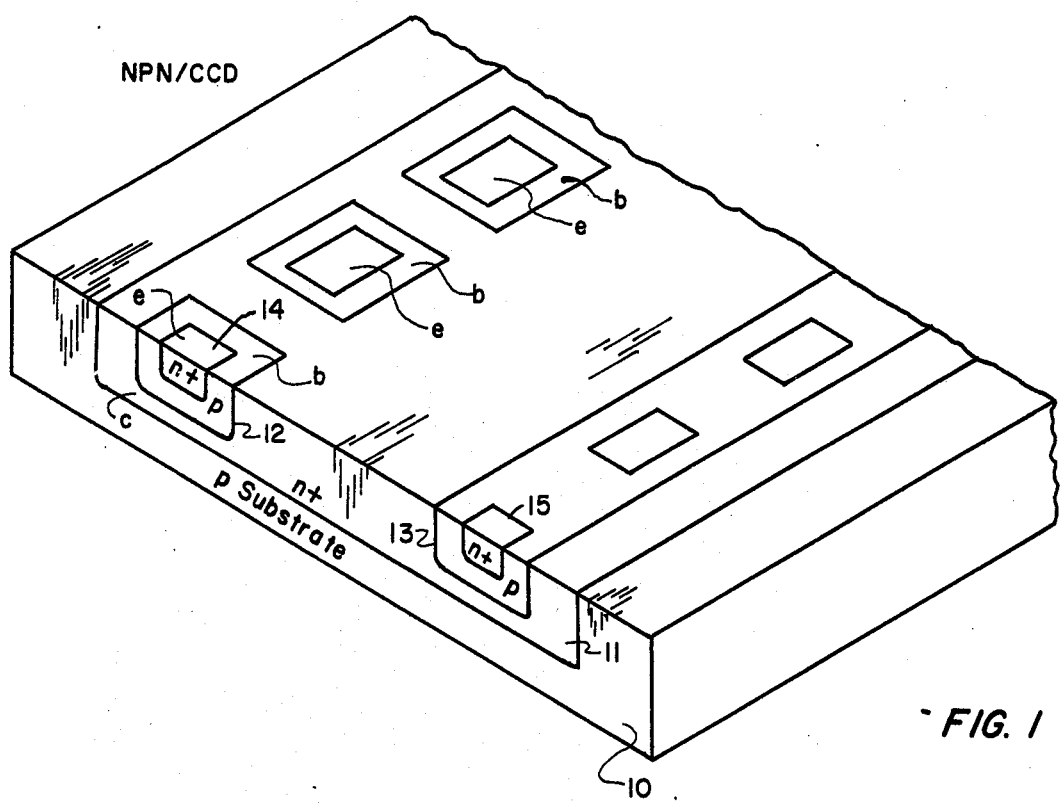
FIG. 1 shows a section of an isometric schematic showing of one embodiment of the invention.

The invention may perhaps be understood best by referring to the drawings, in which FIG. 1 shows a chip with npn transistors and n channel CCDs therein. A p-type silicon chip 10 is n doped at 11 to form a collector well. The chip is also doped to form base 12 for the transistor and channel stop 13 of the CCD. Moreover, the chip is n+ doped to form transistor emitter 14 and CCD 15. Thus, an array of npn transistors and n channel CCDs are produced on the chip. Obviously, many steps are necessary to form the completed chip. A typical sequence of such steps on a <100> p-type silicon chip is the following:

(a) form a 1 μm SiO$_2$ layer in the chip;

(b) apply a first perforated mask to said chip and etch to form a SiO$_2$ mask;

(c) strip said first perforated mask;

(d) n+ dope said chip through the perforations of the SiO$_2$ mask to form transistor collector wells;

(e) apply a second perforated mask;

(f) p dope said chip through the perforations of the second mask to form a p-type channel stop for CCDs and base regions for transistors;

(g) strip said second mask;

(h) apply a third perforated mask;

(i) n+ dope said chip through the perforations of said third mask to form simultaneously n-type CCDs and separate emitter regions for transistors; and (j) strip said third mask.

The common steps for preparing the transistors and CCDs are now complete, except for deposition of interconnecting conductors and passivation. The CCDs may be completed by the following steps:

(k) strip the 1 μm SiO$_2$ mask by etching, (l) grow a 1200 Å SiO$_2$ layer on the chip, (m) deposit a 5000 Å polysilicon layer atop the SiO$_2$ layer, (n) grow 1000 Å SiO$_2$ layer on top of the polysilicon layer, (o) apply a fifth mask on the 1000 Å SiO$_2$ layer, (p) etch the SiO$_2$ through the fifth mask, (q) etch the polysilicon through the fifth mask to the 1200 Å SiO$_2$ layer; the unetched polysilicon form gates for the CCD, (r) strip the fifth mask, (s) place a metal mask atop the chip to cover the perforations etched in the 1000 Å SiO$_2$ and the polysilicon layer, (t) evaporate aluminum through the metal mask to form a mask for threshold shift implantation, (u) remove metal mask, (v) implant boron into the 1200 Å SiO$_2$ adjacent the doped CCD regions at 80 kv; the dose is $1.2 \times 10^{12}/cm^2$, and (w) strip aluminum.

The CCDs, except for aluminum pads (gates) and connectors are now formed. The chip is completed by the following steps:

(aa) hold at 1000° C. in N$_2$ for 1 hour to anneal out the implant damage, (bb) grow a 2000 Å thin SiO$_2$ atop the chip by exposing to dry O$_2$ for 3 hours; this provides insulation between the polysilicon gates and the yet to be deposited Al gates, (cc) etch contact holes through the 2000 Å SiO$_2$ for Al conductor; the holes expose the boron implanted regions and provide paths to the polysilicon gates;

(dd) deposit 1.2 mm Al layer—mask and etch Al to form conductors/pads; a gate (pad) structure is thus produced that includes alternating polysilicon and Al gates between each doped CCD region. The polysilicon gates are all connected together and the Al gates are all connected together whereby a two-phase readout system is formed. The connection between the CCDs and the transistors are also formed but are not part of the invention, per se. In all of steps (k)-(w) and (aa)-(cc) the transistor portion of the chip is protected from the various operations being performed for the CCDs, (ee) place the wafer in forming gas (H$_2$+N$_2$) at 425° C. for 30 minutes to reduce the surface state of the device, and to make good ohmic contact; and (ff) deposit SiO$_x$ for overglass.

The perforations of the various masks are positioned to allow the various circuit elements to be formed in their proper places. It should be understood that each applying-doping-stripping combination of steps may include ten or more actual steps. Typical of such steps are:

1. Form oxide (SiO$_2$) layer on chip.
2. Deposit layer of photoresist on oxide layer.
3. Expose photoresist to light image of photomask.
4. Develop photoresist and wash off excess.
5. Etch oxide layer through photoresist with hydrofluoric acid to yield an oxide mask.
6. Strip photoresist.

7. Coat mask-chip with diffusant and bake to drive-in diffusant.

8. Wash off diffusant.

9. Strip oxide layer.

10. Begin next sequence by forming new oxide layer on chip.

Obviously, other steps, such as washing or drying between the listed steps may be necessary. Diffusion may be accomplished by coating with a diffusant and baking, by ion implantation, etc. Typical doping procedures for the various steps above are (with a 10–30 ohms-cm substrate): for step (d) do the following:

(1) implant phosphorus atoms with a dosage of $0.75-2.0 \times 10^{13}/cm^2$, and with an energy of 140 kev, and (2) drive in at 1200° C. for 24 hours; the desired collector junction depth is 10 mm.

For step (f) the following may be done:

(1) predeposit boron by using boron nitride as a source; predeposition temperature is 950° C., time 30 minutes; the predicted sheet resistivity after predeposition is 60 ohms/□, (2) drive in base and channel stop to a depth of 3.3 μm at 1000° C., with 10 minutes dry, 15 minutes wet, 240 minutes dry nitrogen; the base sheet resistivity after base-channel stop drive-in is about 200 ohms/□.

For step (i) the following steps may be used:

(1) predeposit $POCl_3$ using 950° C. deposition temperature and 10 minutes time, and (2) drive-in emitter-CCD at 1050° C., with 10 minutes dry, 20 minutes wet, and 10 minutes dry cycle.

The chip prepared by the above process may be used as a readout for an array of photodetectors, with the chip transistors acting as buffer amplifiers and with the CCDs being ac driven to act as scanning readout devices. The array of photodetectors may overlie the instant chip with conductors through the passivating layer to connect the detectors and the transistors.

Figure 2:
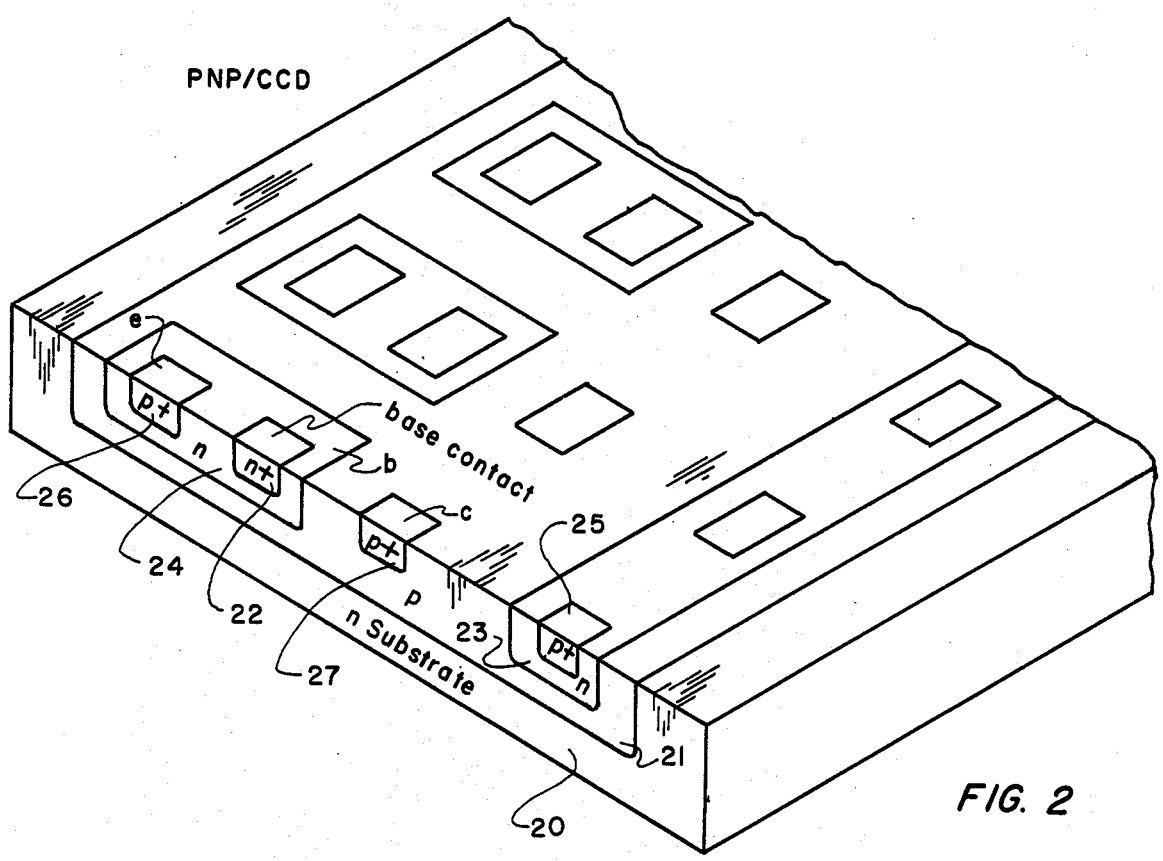
FIG. 2 shows a section of an isometric schematic showing of another embodiment of the invention.

FIG. 2 shows a chip with pnp transistors and p channel CCDs therein. An n-type silicon chip 20 is p doped to form collector well 21. Next, an n+ base contact region 22 is doped into well 21, followed by n doping of regions 23 and 24 into region 21. Region 23 acts as a channel stop for the CCD and region 24 includes region 22. Finally, the chip is p+ doped in regions 25, 26 and 27 to form respectively a CCD, a transistor emitter, and a collector. As described with FIG. 1, many steps are necessary to go from the chips to the doped circuit. A typical sequence of such steps are the following:

(a) form a 1 μm layer in the chips;

(b) apply a first perforated mask to said chip and etch to form a $SiO_2$ mask;

(c) p dope said chip through the perforations of the $SiO_2$ mask to form collector regions for transistors;

(d) apply a second perforated mask to said chip;

(e) n+ dope said chip through the perforations of said second mask to form base contact regions for transistors;

(f) strip said second mask;

(g) apply a third perforated mask to said chip;

(h) n dope said chip through the perforations of said third mask to form simultaneously n-type channel stops for said CCDs and separate base regions for the transistors;

(i) strip said third mask;

(j) apply a fourth perforated mask to said chip;

(k) p+ dope said chip through said perforations of said fourth mask to form both p channel CCDs and emitter regions for the transistors; and (l) strip said fourth mask;

Strip said $SiO_2$ mask;

The common steps for preparing the transistors and CCDs are now complete, leaving only the completion of the CCDs, the deposition of interconnecting leads, and passivation for completion of the inventive chips. The CCDs may be formed with steps equivalent to steps (k)–(w) of the previously described method. As described with the FIG. 1 embodiment, this method includes many more steps than actually listed. That is, the various applying-doping-stripping sequences each include at least the ten steps as recited above.

As one might expect, the transistors as formed by the inventive methods have poorer performance than that of standard buried collector bipolar transistors. One reason for this is that the instant transistors have very high parasitic collector resistance rc; at 77° K., it is usually between 500 ohms and 1.5 kilohms. Moreover, the breakdown voltage between base and collector of the instant transistors is quite low, above 10 volts; also, the parasitic capacitance is high because of higher collector concentration.

However, these drawbacks do not reduce the attractiveness of the instant transistors as buffer amplifiers for the instant CCDs because (1) the gain of the buffer amplifier is proportional to $R_1/(rc+R_1)$, wherein $R_1$ is load resistance; if $R_1$ is between 5 and 20 kilohms, rc does not seriously reduce the gain of the buffer amplifier, (2) for the usual buffer supply voltage of about 6 volts, a 10 volt breakdown voltage is sufficient and (3) the parasitic capacitance is less than 8 pf; although this is large compared to standard bipolar devices, it is small enough to give a bandwidth wider than 1 MHz.

I claim:

1. A method of treating a p-type silicon chip to produce on said chip at least a charge-coupled device (CCD) and a transistor, the method including the steps of:

forming a $SiO_2$ layer on said chip;

applying a first perforated mask to said chip and etching through said first mask to form a $SiO_2$ mask;

stripping said first mask;

n+ doping said chip through the perforation of said $SiO_2$ mask to form a transistor collector well;

applying a second perforated mask;

p doping said chip through the perforations of said second mask to form a p-type channel stop for said CCD and a base region for said transistor;

stripping said second mask;

applying a third perforated mask;

n+ doping said chip through the perforations of said third mask to form simultaneously an n-type CCD and a separate emitter region for said transistor;

stripping said third mask;

stripping said $SiO_2$ mask by etching;

applying a fourth perforated mask on said chip;

implanting dopant adjacent said n-type CCD for a CCD threshold shift region;

removing said fourth mask;

wherein the perforations of the various masks expose various regions on said chip during the various steps.

2. The method as defined in claim 1 wherein the regions on said chip is exposed by the perforations of said second mask are within the regions on said chip as exposed by the perforation of said first mask.

3. The method as defined in claim 2 wherein the regions on said chip as exposed by the third mask are within but of less area than the regions as exposed by the perforations of said second mask.

4. The method as defined in claim 3 wherein the p doping penetrates deeper into said chip than said n+ doping.

5. The circuit made by the process of claim 1.

6. A method of treating an n-type silicon chip to produce on said chip at least a charge-coupled device (CCD) and a transistor, the method including the steps of:

forming a SiO$_2$ layer on said chip;
applying a first perforated mask to said chip and etching through said first mask to form a SiO$_2$ mask;
stripping said first mask;
p doping said chip through the perforation of said mask to form a transistor collector well;
applying a second perforated mask to said chip;
n+ doping said chip through the perforations of said second mask to form a base contact region for said transistor;
stripping said second mask;
applying a third perforated mask to said chip;
n doping said chip through the perforations of said third mask to form simultaneously an n-type channel stop for said CCD and a separate base region for said transistor;
stripping said third mask;
applying a fourth perforated mask to said chip;
p+ doping said chip through said perforations of said forth mask to form both a p channel CCD and an emitter region for said transistor;
stripping said fourth mask;
stripping said SiO$_2$ mask by etching;
applying a fifth perforated mask on said pattern and said chip;
implanting dopant adjacent said p channel CCD for a CCD threshold shift region;
removing said fifth mask;
wherein the perforations of said masks expose various regions on said chip.

7. The method as defined in claim 6 wherein the regions on said chip is exposed by the perforations of said second mask are within the regions on said chip as exposed by the perforation of said first mask.

8. The method as defined in claim 7 wherein the region of said chip as exposed by said third mask include a region enclosing but of less area than a region exposed by said second mask.

9. The method as defined in claim 8 wherein the regions of said chip as exposed by said fourth mask are within but of less area then the regions of said chip as exposed by said third mask.

10. The circuit made by the process of claim 6.